United States Patent
Del Puppo et al.

(10) Patent No.: US 7,682,980 B2
(45) Date of Patent: Mar. 23, 2010

(54) METHOD TO IMPROVE PROFILE CONTROL AND N/P LOADING IN DUAL DOPED GATE APPLICATIONS

(75) Inventors: Helene Del Puppo, Fremont, CA (US); Frank Lin, Fremont, CA (US); Chris Lee, Oakland, CA (US); Vahid Vahedi, Albany, CA (US); Thomas A. Kamp, San Jose, CA (US); Alan J. Miller, Moraga, CA (US); Saurabh Ullal, South San Francisco, CA (US); Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 514 days.

(21) Appl. No.: 11/627,016

(22) Filed: Jan. 25, 2007

(65) Prior Publication Data

US 2007/0117399 A1     May 24, 2007

Related U.S. Application Data

(63) Continuation of application No. 10/607,612, filed on Jun. 27, 2003, now Pat. No. 7,186,661, which is a continuation-in-part of application No. 10/376,227, filed on Mar. 3, 2003, now Pat. No. 7,098,141.

(51) Int. Cl.
    *H01L 21/302* (2006.01)
(52) U.S. Cl. .................. 438/710; 438/713; 438/719; 438/723
(58) Field of Classification Search ............. 438/710, 438/713, 719, 723
    See application file for complete search history.

(56) References Cited

U.S. PATENT DOCUMENTS

| | | | |
|---|---|---|---|
| 5,670,397 A * | 9/1997 | Chang et al. | 438/232 |
| 5,773,357 A * | 6/1998 | Shishiguchi | 438/479 |
| 6,703,269 B2 * | 3/2004 | Brown et al. | 438/199 |
| 6,872,322 B1 * | 3/2005 | Chow et al. | 216/67 |
| 7,186,661 B2 * | 3/2007 | Puppo et al. | 438/713 |

* cited by examiner

*Primary Examiner*—Binh X Tran
(74) *Attorney, Agent, or Firm*—Martine Penilla & Gencarella, LLP

(57) ABSTRACT

A method for etching a polysilicon gate structure in a plasma etch chamber is provided. The method initiates with defining a pattern protecting a polysilicon film to be etched. Then, a plasma is generated. Next, substantially all of the polysilicon film that is unprotected is etched. Then, a silicon containing gas is introduced and a remainder of the polysilicon film is etched while introducing a silicon containing gas. An etch chamber configured to introduce a silicon containing gas during an etch process is also provided.

10 Claims, 7 Drawing Sheets

METHOD TO IMPROVE PROFILE CONTROL AND N/P LOADING IN DUAL DOPED GATE APPLICATIONS

CROSS REFERENCE TO RELATED APPLICATION

This application is a continuation of and claims priority from U.S. patent application Ser. No. 10/607,612, filed on Jun. 27, 2003, now U.S. Pat. No. 7,186,661, which is a continuation-in-part and claims priority from application Ser. No. 10/376,227, filed on Mar. 3, 2003, now U.S. Pat. No. 7,098,141. The disclosures of these applications are incorporated herein by reference for all purposes.

BACKGROUND OF THE INVENTION

The present invention relates to an improved method for plasma etching shallow trenches and/or gate structures in the fabrication of semiconductor devices.

During the manufacture of semiconductor-based products such as integrated circuits, etching and/or deposition steps may be used to build up or remove layers of material on a semiconductor substrate. A conventional etching procedure involves the use of one or more etch gases energized into a plasma state to effect plasma etching of a layer of material. Such plasma etching has been used to provide shallow trench isolation of individual transistors in an integrated circuit. After etching the trench, the trench is filled in with a dielectric material. Commonly assigned U.S. Pat. Nos. 6,218,309 and 6,287,974 disclose a shallow trench plasma etching process.

In manufacture of transistors, it is conventional to etch the pattern of a photoresist layer into an underlying hard mask layer, strip the photoresist layer, and etch the pattern of the hard mask into a polysilicon layer down to a gate oxide layer. See, for example, U.S. Pat. No. 6,283,131. During polysilicon etch, e.g., reactive ion etching processes, the vertical profile is achieved by passivating the polysilicon lines laterally while etching the exposed polysilicon layer vertically. The lack of passivation during the etch process may lead to bowed or re-entrant polysilicon lines, undercut at the mask/polysilicon interface, as well as notching at the bottom of the polysilicon lines. At the same time, excess passivation may lead to tapered profiles and a foot at the base of the polysilicon lines.

Additionally, for dual doped applications, where different types of doping regions co-exist on a substrate, the etching behavior of the different doped regions also differs. Consequently, this may lead to profile differences which induces critical dimension variations between the differently doped regions. Furthermore, etch rate micro-loading may also occur, thereby negatively impacting gate integrity.

In view of the foregoing, there is a need for a method and apparatus to provide a proper passivation level to ensure a notch free etch profile. In addition, there is a need to mitigate profile differences and etch rate micro-loading for dual doped silicon etch processes.

SUMMARY OF THE INVENTION

Broadly speaking, the present invention fills these needs by introducing a passivation enhancing gas during an etching operation in order to prevent notching. It should be appreciated that the present invention can be implemented in numerous ways, including as an apparatus, a system, a device, or a method. Several inventive embodiments of the present invention are described below.

A method of etching a shallow trench in a silicon layer includes supporting a single semiconductor substrate on a substrate support in a plasma etch chamber and plasma etching a shallow trench having a depth of less than 1 µm with a width of less than 0.5 µm in a silicon layer on the semiconductor substrate using an etch gas which includes a silicon containing gas. The silicon-containing gas can be used to enhance profile control and/or critical dimension control by controlled silicon deposition across the semiconductor substrate and/or provide top and/or bottom rounding.

According to one embodiment, the silicon containing gas is supplied to the chamber at a first flow rate during etching of an upper region of the silicon trench layer, the silicon containing gas is supplied to the chamber at a second flow rate during etching of a middle region of the silicon trench layer, and the silicon containing gas is supplied to the chamber at a third flow rate during etching of a lower region of the silicon trench layer, the first and third flow rates being greater than the second flow rate. The first flow rate is preferably effective to provide top rounding of the trench and/or the third flow rate is preferably effective to provide bottom rounding of the trench. Preferably the upper region comprises less than 30% of the trench depth and/or the bottom region comprises less than 30% of the trench depth and/or the sidewalls of the trench are slopped at an angle of 70 to 89°. In an embodiment, the first flow rate is effective to taper sidewalls of the upper region of the trench at an angle of less than 80°, the second flow rate is effective to taper the sidewalls of the middle region of the trench at an angle of greater than 80°, and the third flow rate is effective to taper sidewalls of the lower portion of the trench at an angle of less than 80°. For example, the first flow rate can be effective to taper sidewalls of the upper region of the trench at an angle of 72 to 82°, the second flow rate can be effective to taper the sidewalls of the middle region of the trench at an angle of 82 to 88°, and the third flow rate can be effective to taper sidewalls of the lower portion of the trench at an angle of 72 to 82°.

The silicon containing gas can include $SiCl_4$, $SiBr_4$, $CH_3SiH_3$, $HSiCl_3$, $Si_2H_6SiF_4$, $SiH_2Cl_2$, $SiH_4$ or mixtures thereof. The etch gas further can also include a halogen-containing gas selected from $Cl_2$, HBr, $C_x$, $F_y$, $C_xF_yH_2$, $SF_6$, HCl or mixtures thereof. In a preferred embodiment, the $Cl_2$ is supplied to the chamber at a flow rate of 5 to 500 sccm and the silicon containing etch gas comprises $SiCl_4$ supplied to the chamber at a flow rate of 1 to 100 sccm. In another embodiment, the etch gas comprises $Cl_2$, $O_2$, HBr, He, $CF_4$, HCl, Ar, $N_2$, $SF_6$ or mixtures thereof. Preferably, the etch gas is energized into a plasma state by inductively coupling radio frequency energy into the plasma chamber and/or the chamber is at a pressure of less than 100 mTorr.

The silicon layer can be a portion of a single crystal silicon wafer beneath a mask such as a silicon nitride mask layer. Alternatively, the silicon layer can be an epitaxial layer, a strained silicon layer or a silicon-germanium layer on a substrate such as a single crystal silicon wafer.

A method of etching a gate structure on a semiconductor substrate includes supporting a semiconductor substrate on a substrate support in a plasma etch chamber and plasma etching a gate structure in a silicon layer on the semiconductor substrate using an etch gas which includes a silicon containing gas.

In the gate etch, the etch gas can include HBr, $O_2$, $Cl_2$, He, $CF_4$, $N_2$, $NF_3$, Ar, or mixture thereof and/or the silicon containing gas can include $SiCl_4$, $SiBr_4$, $CH_3SiH_3$, $Si_2H_6$, $SiF_4$, $SiH_2Cl_2$, $HSiCl_3$, $SiH_4$, or mixtures thereof. The gate stack preferably comprises a layer of polycrystalline silicon (polysilicon) on a silicon wafer wherein the polycrystalline silicon layer is between an underlying gate oxide and an overlying hard or soft mask layer such as a silicon nitride mask layer or photoresist. In an embodiment, an upper portion of the polysilicon layer is etched without the silicon containing gas and a lower portion of the polysilicon layer is etched while supplying the silicon containing gas at a flow rate of 1 to 100 sccm. Preferably, the etch glass is energized into a plasma state by inductively coupling radio frequency energy into the plasma chamber and/or the chamber is at a pressure of less than 100 mTorr. During the gate etch, the silicon-containing gas can be used to enhance profile control and/or critical dimension control by controlled silicon deposition across the semiconductor substrate. In a preferred process, the gate structure is etched in three steps, the etch gas including $Cl_2$, HBr, $O_2$ and $CF_4$ during the first step, the etch gas including HBr and $O_2$ during the second step and the etch gas including HBr, $O_2$ and He during the third step, the HBr being supplied to the chamber at a higher flow rate during the second step than during the third step.

In one embodiment, a method for etching a polysilicon gate structure in a plasma etch chamber is provided. The method initiates with defining a pattern protecting a polysilicon film to be etched. Then, a plasma is generated. Next, substantially all of the polysilicon film that is unprotected is etched. Then, a silicon containing gas is introduced and a remainder of the polysilicon film is etched while introducing a silicon containing gas.

In another embodiment, a method for decreasing etch rate micro-loading between differently doped material of a substrate is provided. The method initiates with striking a plasma in a chamber. Then, the substrate is etched. Next, a passivation layer is formed from byproducts generated from the etching. Then, the passivation layer is enhanced.

In yet another embodiment, a semiconductor processing system is provided. The semiconductor processing system includes a chamber. The chamber includes a gas inlet, a top electrode configured to strike a plasma inside the chamber, and a support for holding a substrate. A controller configured to detect a passivation starved condition during an etching operation is provided. The controller is further configured to introduce a passivation enhancing gas through the gas inlet during the etching operation in response to detecting the passivation starved condition.

In still yet another embodiment, a method for enhancing a polysilicon to oxide selectivity during an etching process is provided. The method initiates with providing a substrate to be plasma etched in a chamber. Then a plasma is struck in the chamber. Next, a thin layer of a silicon containing oxide is deposited over a gate oxide as the substrate is being etched.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

FIG. 2 is a schematic illustration of a shallow trench etching process wherein the photoresist and BARC layers have been removed and the silicon nitride and pad oxide layers have been etched through.

DETAILED DESCRIPTION OF THE PREFERRED EMBODIMENTS

Figure 1:
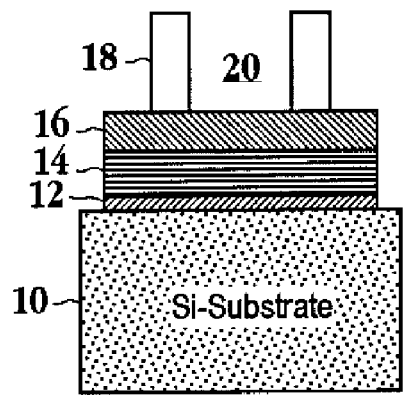
FIG. 1 is a schematic illustration of a stack of layers on a silicon substrate prior to forming a shallow trench isolation feature.

Several exemplary embodiments of the invention will now be described in detail with reference to the accompanying drawings. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Many plasma etch applications rely on the generation of a passivation layer to obtain the desired feature profile. The primary mechanism for profile control involves the balance of etch and deposition reactions. The etch reactions are generally directly controlled by the reaction chamber parameters such as input power, pressure, and gas flows. In plasma etching of silicon wafers, etch reaction products are the primary deposition source with the result that deposition mechanisms are indirectly controlled.

For shallow trench and gate applications, various etch gas chemistries are used. For example, when using HBr—$O_2$ etch gas chemistries, the passivation layer is primarily made up of $Si_xBr_yO_z$. For $Cl_2$—$O_2$ etch gas chemistries, the passivation layer is primarily made of $Si_xCl_yO_z$. Other constituents of the passivation layer can include N, C, H and F. Moreover, as a result of etching of silicon wafer and/or chamber materials such as quartz components, volatile silicon etch byproducts are incorporated into the passivation layer.

As explained above, silicon can be incorporated in passivation layers due to etching of silicon sources such as silicon wafers and/or chamber materials. Such silicon sources are secondary products that are not directly controlled by the etch gas chemistry. Moreover, as the volatile silicon etch byproducts are transported from the wafer surface toward the vacuum evacuation port, there is a finite possibility of deposition of the silicon-containing byproducts on the wafer surface. This can lead to non-uniform silicon byproduct concentration across the wafer and lead to non-uniformity of the etched feature profile and critical dimension.

Many shallow trench applications require top and/or bottom rounding. U.S. Pat. No. 5,807,789 describes a shallow trench with tapered profile and rounded corners. The primary mechanism for rounding is by creating redeposition byproducts. The use of polymer spacers for top rounding of shallow trench isolation regions is described in U.S. Pat. No. 5,801,083. Commonly assigned U.S. Pat. Nos. 6,218,309 and 6,287,974 describe top rounding of shallow trench isolation features. According to one embodiment, a method of etching a shallow trench in a silicon layer includes supporting a single semiconductor substrate on a substrate support in a plasma etch chamber and plasma etching a shallow trench having a depth of less than 1 µm and a width of less than 0.5 µm in a silicon layer on the semiconductor substrate using an etch gas which includes a silicon containing gas.

The plasma may be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261 the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

The process may be carried out in an inductively coupled plasma reactor maintained at a desired vacuum pressure by a vacuum pump connected to an outlet in a wall of the reactor. Etching gas can be supplied to a showerhead or injector arrangement by supplying gas from a gas supply to a plenum extending around the underside of a dielectric window. A high density plasma can be generated in the reactor by supplying RF energy from an RF source to an external RF antenna such as a planar spiral coil having one or more turns outside the dielectric window on top of the reactor. The plasma generating source can be part of a modular mounting arrangement removably mounted in a vacuum tight manner on the upper end of the reactor.

A wafer may be supported within the reactor on a substrate support such as a cantilever chuck arrangement removably supported by a modular mounting arrangement from a sidewall of the reactor. Such a substrate support is at one end of a support arm mounted in a cantilever fashion such that the entire substrate support/support arm assembly can be removed from the reactor by passing the assembly through an opening in the sidewall of the reactor. The substrate support may include a chucking apparatus such as an electrostatic chuck (ESC) and the substrate can be surrounded by a dielectric focus ring. The chuck may include an RF biasing electrode for applying an RF bias to the substrate during an etching process. The etching gas supplied by a gas supply may flow through channels between the window and an underlying gas distribution plate (GDP) and enter the interior of the chamber through gas outlets in the GDP. The reactor may also include a heated liner extending from the GDP.

The process may also be carried out in a parallel plate plasma reactor which includes an interior maintained at a desired vacuum pressure by a vacuum pump connected to an outlet in a wall of the reactor. Etching gas can be supplied to a showerhead electrode by supplying gas from a gas supply and a medium density plasma may be generated in the reactor by supplying RF energy from one or more RF sources to the showerhead electrode and/or a bottom electrode. Alternatively, the showerhead electrode may be electrically grounded and RF energy at two different frequencies can be supplied to the bottom electrode.

It will be apparent to those skilled in the art that the flow rates of the various gases will depend on factors such as the type of plasma reactor, the power settings, the vacuum pressure in the reactor, the dissociation rate for the plasma source, etc.

The reactor pressure is preferably maintained at a level suitable for sustaining a plasma in the reactor. In general, too low a reactor pressure may lead to plasma extinguishment, whereas in a high density etch reactor too high a reactor pressure can lead to the etch stop problem. For high density plasma reactors, the reactor is preferably at a pressure below 100 mTorr. For medium density plasma reactors, the reactor is preferably at a pressure from 30 to 100 mTorr, more preferably from 50 to 100 mTorr. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent deleterious side reactions such as burning of any photoresist on the substrate and formation of undesirable reactant gas radicals. In high and medium high density plasma reactors, it is sufficient to cool the substrate support to a temperature of −10 to +80° C. The substrate support may include a bottom electrode for supplying an RF bias to the substrate during processing thereof and an ESC for clamping the substrate. For example, the substrate can comprise a silicon wafer which is electrostatically clamped and cooled by supplying helium (He) at a desired pressure between the wafer and top surface of the ESC. In order to maintain the wafer at a desired temperature, the He may be maintained at a pressure of 10 to 30 Torr in the space between the wafer and the chuck.

Figure 2:
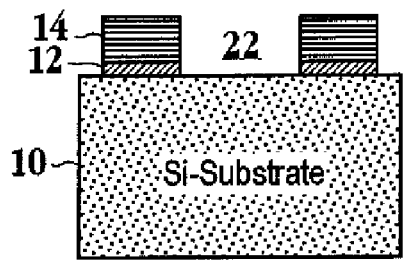
Figure 3:
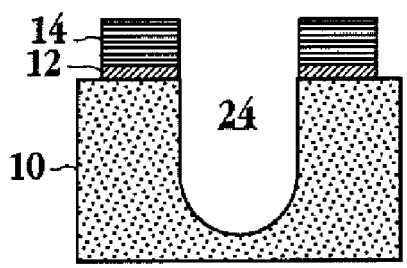
FIG. 3 is a schematic illustration of a shallow trench isolation feature etched into a silicon substrate.

FIGS. 1-3 show schematic representations of how a shallow trench may be etched into a silicon layer. As shown in FIG. 1, a silicon substrate 10 includes a stack of layers thereon including a 100 Å pad oxide 12, a 1500 Å thick layer of silicon nitride 14, a 600 Å thick bottom antireflective coating (BARC) 16, and a 3200 Å thick layer of photoresist 18 which has been previously patterned to provide an opening 20. In etching shallow trenches on a silicon wafer, the photoresist 18 will include many openings 20 corresponding to the desired trench locations. The silicon nitride layer 14 is opened at the locations of the openings 20 to form a patterned hard mask.

In opening the hard mask 14, the BARC layer 16 is opened with a plasma etch. In an exemplary BARC open step, the chamber can be at a vacuum pressure of 5 mTorr and the antenna used to inductively couple radio frequency energy into the chamber can be set at 350 watts. The substrate support may include an electrode which provides an RF bias by powering the electrode with 88 watts. The BARC may be opened using a plasma etch with 50 sccm $CF_4$ for 60 seconds while maintaining the temperature of the wafer at about 60° C. Next, the silicon nitride layer 14 and pad oxide 12 are opened to form openings 22 with the chamber set at the same pressure but raising the antenna power to 1000 watts. The silicon nitride layer can be etched with 70 sccm $CHF_3$ and 300 sccm Ar for 44 seconds while maintaining the wafer temperature at about 60° C. After that, the photoresist and BARC are stripped using a chamber pressure of 10 mTorr and 1000 watts to the antenna. The photoresist may be stripped using 200 sccm $O_2$ for 45 seconds.

As a result of the strip step, the BARC and photoresist layer have been removed and areas of exposed silicon have become oxidized from the $O_2$ plasma. In an exemplary process, the chamber is set at 5 mTorr and 350 watts power is supplied to the antenna. The oxidized silicon is etched using 50 sccm $CF_4$ for 7 seconds while maintaining the wafer temperature at about 60° C. Next, the silicon substrate may be etched with the chamber pressure set at 50 mTorr and 1000 watts power being supplied to the antenna. The bottom electrode may be supplied about 220 watts power and the etch gas can include 125 sccm $Cl_2$, 14 sccm $O_2$ and 14 sccm $N_2$ while maintaining the wafer temperature at about 60° C. In order to provide desired rounding and/or profile and/or CD control, a silicon containing gas such as $SiCl_4$ can also be added to the etch gas. After forming the trench structure 24 as shown in FIG. 3, the wafer can be cleaned using a 2 minute HF dip followed by a deionized water spin rinse.

Figure 4:
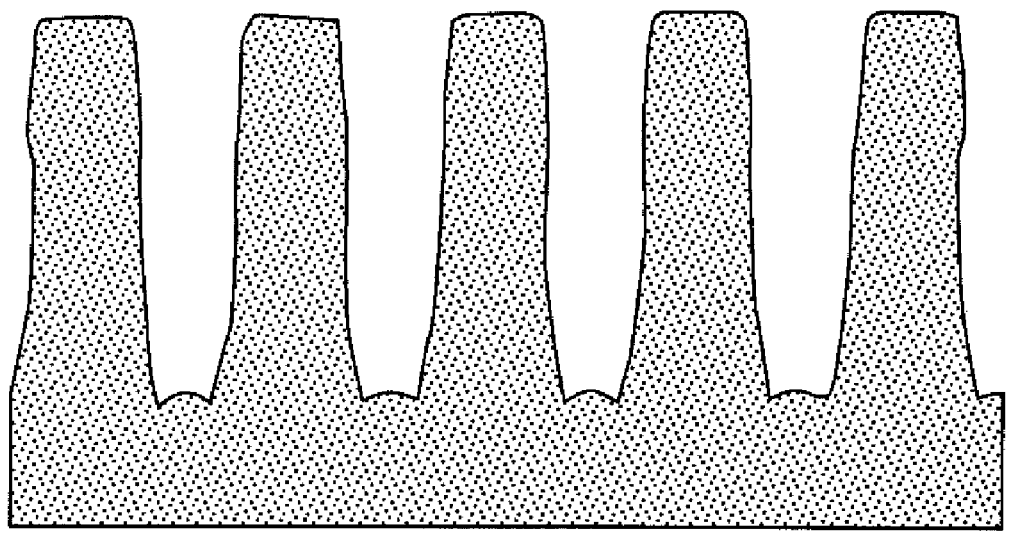
FIG. 4 is a photomicrograph of shallow trench isolation features having a bowed profile and subtrenched bottom.
Figure 5:
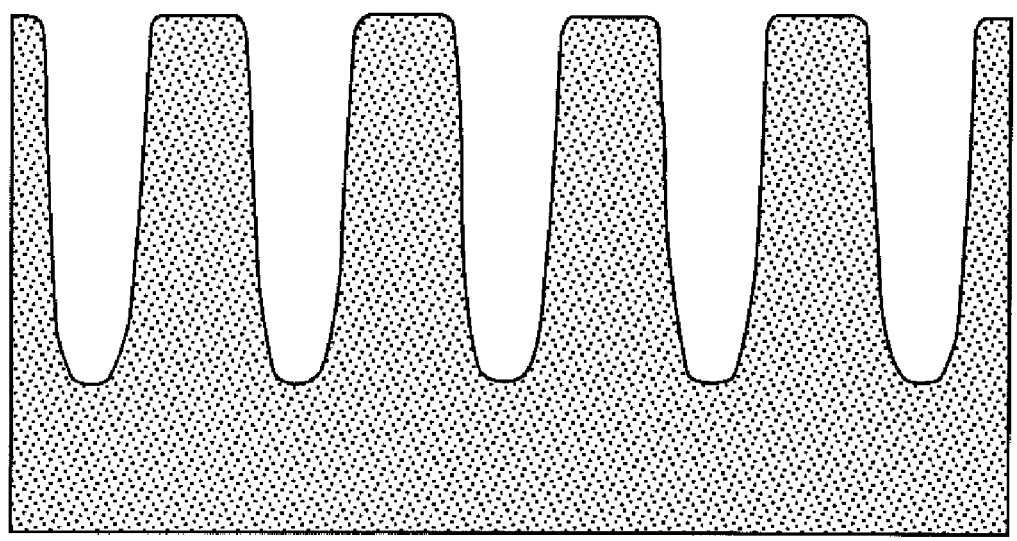
FIG. 5 is a photomicrograph of shallow trench isolation features etched with a silicon-containing gas.
Figure 6:
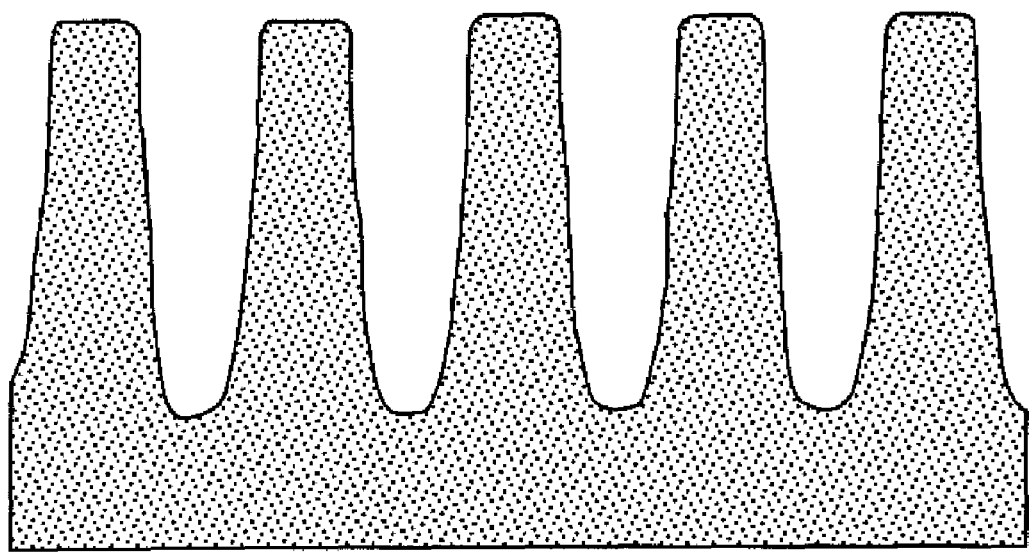
FIG. 6 is a photomicrograph of shallow trench isolation features which include top and bottom rounding.

FIG. 4 is a photomicrograph of a trench structure formed using 125 sccm $Cl_2$ and no $SiCl_4$ addition to the etch gas. As shown in FIG. 4, the trenches have a bowed profile and subtrenched bottoms. Improved critical dimension (CD) and profile control can be obtained by adding a silicon-containing gas to the etch gas. FIG. 5 is a photomicrograph of a trench structure formed when a silicon-containing gas is used during the shallow trench etch. The trench structure shown in FIG. 5 was etched with 75 sccm $Cl_2$ and 25 sccm $SiCl_4$. FIG. 6 is a photomicrograph of tapered trenches having rounded tops and bottoms as a result of using a silicon-containing gas during the shallow trench etch.

Figure 7:
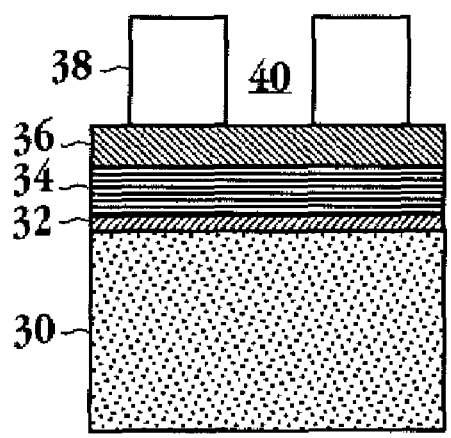
FIG. 7 is a schematic of a silicon substrate having a stack of layers thereon prior to carrying out a gate etch.
Figure 8:
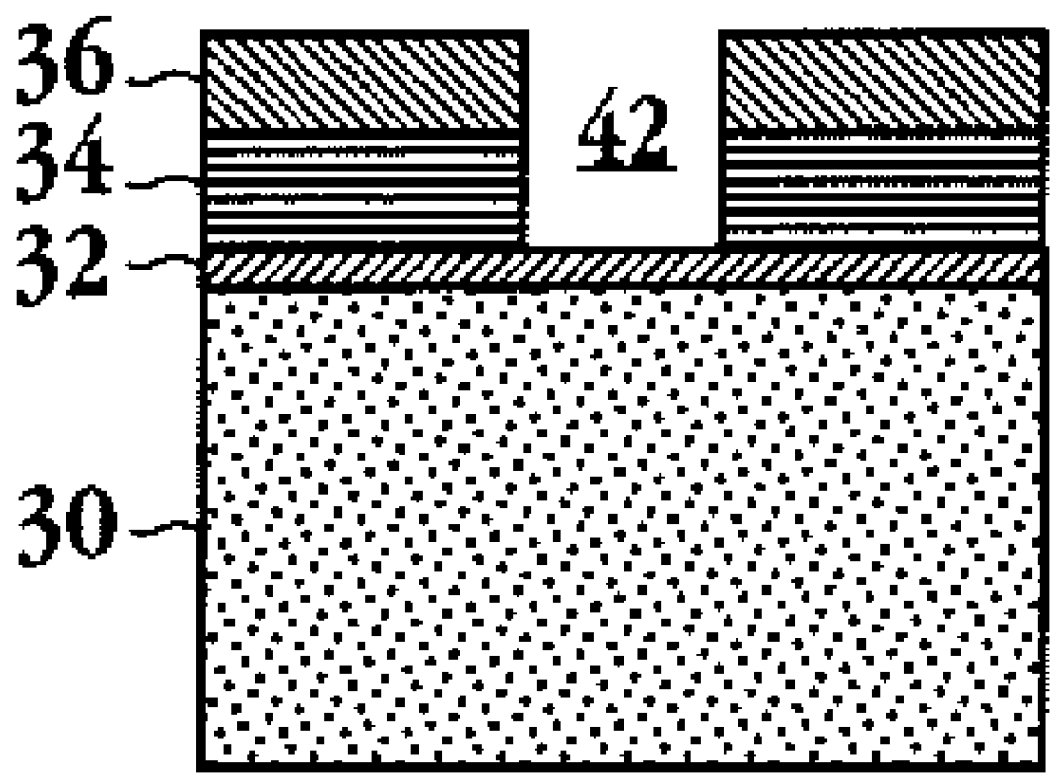
FIG. 8 is a schematic illustration of a silicon substrate having silicon nitride and polysilicon layers thereon etched through to a gate oxide.

FIGS. 7 and 8 are schematics representative of a gate etch. As shown in FIG. 7, a silicon wafer 30 includes a stack of layers thereon which includes a 15 Å thick layer of oxide 32, a 1500 Å thick layer of polysilicon 34, a 200 Å thick layer of silicon nitride 36, and a 2000 Å thick layer of photoresist 38, which has been patterned to include openings 40 therein corresponding to the locations of the gate etch. It should be appreciated that the barrier layer is not limited to silicon nitride. For example, one skilled in the art will appreciate that the hardmask in gate application is silicon dioxide (SiO2) or silicon oxynitride (SiOxNy). In addition, the thickness of the barrier layer may be 300 Å, or any other suitable thickness. While a single opening 40 is shown in FIG. 7, in etching gate structures on a wafer there will be many openings 40 corresponding to the desired locations of the gates.

An exemplary process of a gate etch is as follows. Initially, a trimming step is carried out with the chamber pressure set at 15 mTorr and the antenna power set at 400 watts. The etch gas for the trimming step can include 30 sccm HBr and 10 sccm $O_2$. Then, the silicon nitride layer 36 is etched with the chamber set at 10 sccm $CF_4$ to provide an opening in the silicon nitride layer 36 corresponding to the opening 40. Then, the polysilicon is etched in four steps which includes a breakthrough step, a first main etch, a second main etch and an over etch. In the breakthrough step, the native oxide present at the surface of the silicon is etched because some chemistries, e.g., HBr, do not etch the $SiO_2$ easily or uniformly. It will be apparent to one skilled in the art that where the chemistry contains $CF_4$, the use of a breakthrough step is not necessary. In the first main etch, the chamber is set at 10 mTorr and the antenna is set at 800 watts power. The etch gas includes 50 sccm $Cl_2$, 175 sccm HBr, 60 sccm $Cf_4$ and 5 sccm $O_2$. In the second main etch, the chamber is set at 30 mTorr and the antenna is set at 350 watts. The etch gas for the second main etch includes 300 sccm HBr and 3 sccm $O_2$. In the over etch, the chamber is set at 80 mTorr and the antenna is supplied 500 watts power. The etch gas in the over etch includes 130 sccm HBr, 4 sccm $O_2$ and about 270 sccm He. A silicon containing gas such as $SiCl_4$ can be added to the first or second main etch and/or the over etch to improve gate profile control and within wafer CD control. After the polysilicon etch, an opening 42 extends to the gate oxide 32, as shown in FIG. 8.

Figure 9A:
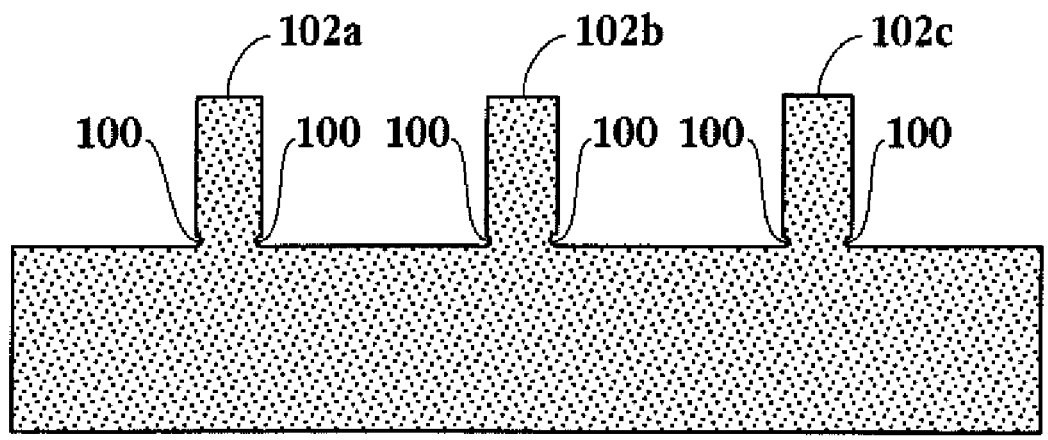
FIG. 9A is a simplified schematic diagram of an etch profile without the use of a silicon containing gas in the etching gas mixture during the over etch step.

FIG. 9A is a simplified schematic diagram of an etch profile without the use of a silicon containing gas in the etching gas mixture during the over etch step. Etched gate feature 102a through 102c include notches 100 at the base of each of the etch-gate features. As preserving the gate integrity at the end of the etch process when polysilicon stringers are removed, i.e., during the over-etch step, high selectivity to the oxide needs to be maintained while performing the over-etch step. As is generally known, gate oxide pitting is a phenomenon by which the gate oxide, or the gate material, is etched selectively in small localized areas resulting in etching of the silicon underneath, thereby creating pits.

Figure 9B:
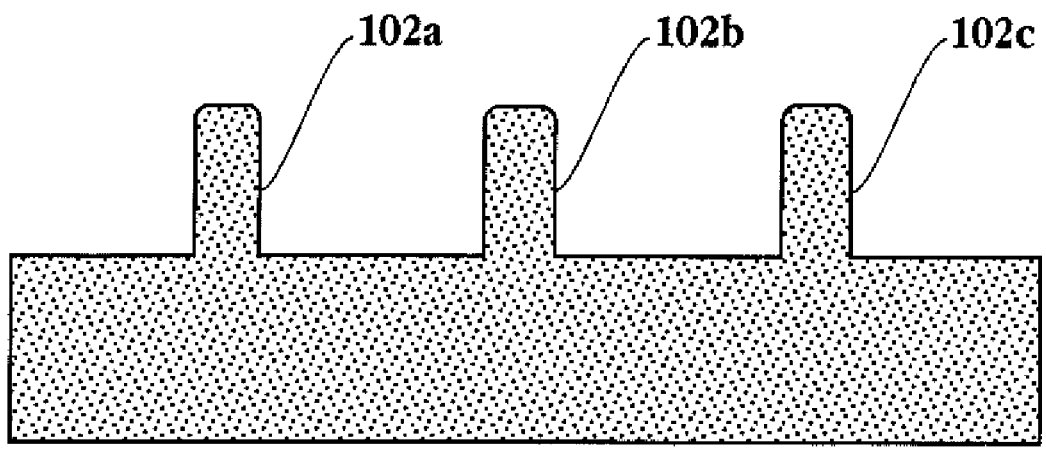
FIG. 9B is a photomicrograph of an etched gate feature with CD control.

FIG. 9B is an exemplary photomicrograph of an etched gate feature with critical dimension control obtained by adding a silicon containing gas to the over-etch process in accordance with one embodiment of the invention. Silicon-containing gas in the silicon etching gas mixture increases the amount of sidewall passivation in order to mitigate any notching. Thus, gate feature 102a through 102c are shown having a notch-free base due to the sidewall passivation provided by the addition of silicon-etching gas. In one embodiment, with respect to hard mask gate applications, the sidewall passivation mainly consists of a Si, O, X-based material with X being a halogen or a mixture of halogens, e.g., bromine, chlorine, fluorine, etc. One skilled in the art will appreciate that the halogen may be dependent on the etch chemistry. Here, the first two etch steps incorporate silicon into the passivation layer from the substrate through reactions involving etch byproducts. However, at the end of the polysilicon etch, during the over-etch step, the silicon-based byproducts are depleted due to the depletion of silicon material to be etched. At the same time, the etching species concentration is increased. As a result, little passivation is created during the over-etch step and the existing passivation at the base of the line can be attacked by the etching species resulting in notching of the polysilicon line. However, the addition of silicon during the over-etch step will replace the depleted silicon previously supplied by the silicon material being etched.

Figure 10:
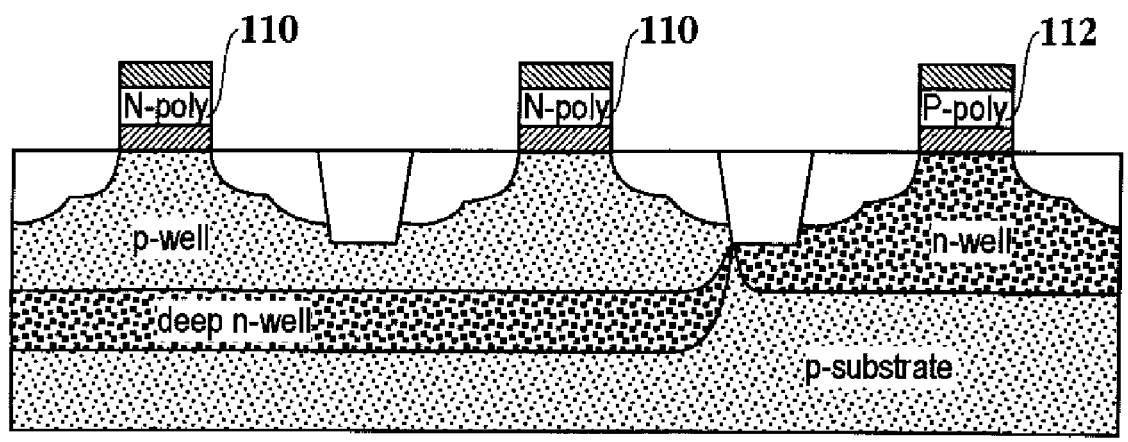
FIG. 10 is a simplified cross sectional schematic diagram illustrating a dual doped gate structure that has been etched with a silicon containing gas utilized to mitigate etch rate differences caused by the dissimilar doping regions.

FIG. 10 is a simplified cross sectional schematic diagram illustrating an etched dual doped gate structure. Here, gates 110 are composed of n-doped polysilicon, while gate 112 is composed on p-doped polysilicon. It should be appreciated that adding a silicon containing gas during the entire etch process enhances the formation of a passivation layer, thereby mitigating differences caused by the dissimilar doped gate structures on the substrate. The amount of the lateral attack can also vary with the doping type during the last steps of the gate-etch process when the etch chemistry becomes more selective to the gate oxide. Consequently, the profiles defined in the first step of the silicon etch may be altered in the final steps, leading to profile and critical dimension differences between the various doped regions, i.e., also referred to as n/p profile loading. Thus, in another embodiment, the addition of a source of silicon on a gas mixture in the last steps of the etch, e.g., the over-etch step, decreases the etch rate micro-loading between different types of doped silicon. In addition, the silicon gas adds more passivation to the lines, thereby reducing the impact of the lateral etch differences between the various types of doped silicon on the profile definition.

Accordingly, adding a silicon-containing gas in the etch gas mixture during the silicon etch will eliminate the notching at the base of the features. Additionally, the silicon-containing gas in the etch-gas mixture during the over etch step will increase the selectivity to oxide. Furthermore, a silicon-containing gas in the etch gas mixture during the silicon etch will reduce the profile differences between the various type of doped silicon present on the same substrate. That is, adding a silicon-containing gas in the etch gas mixture during the silicon etch will reduce the critical dimension bias differences between n-doped, p-doped or undoped lines.

Figure 11:
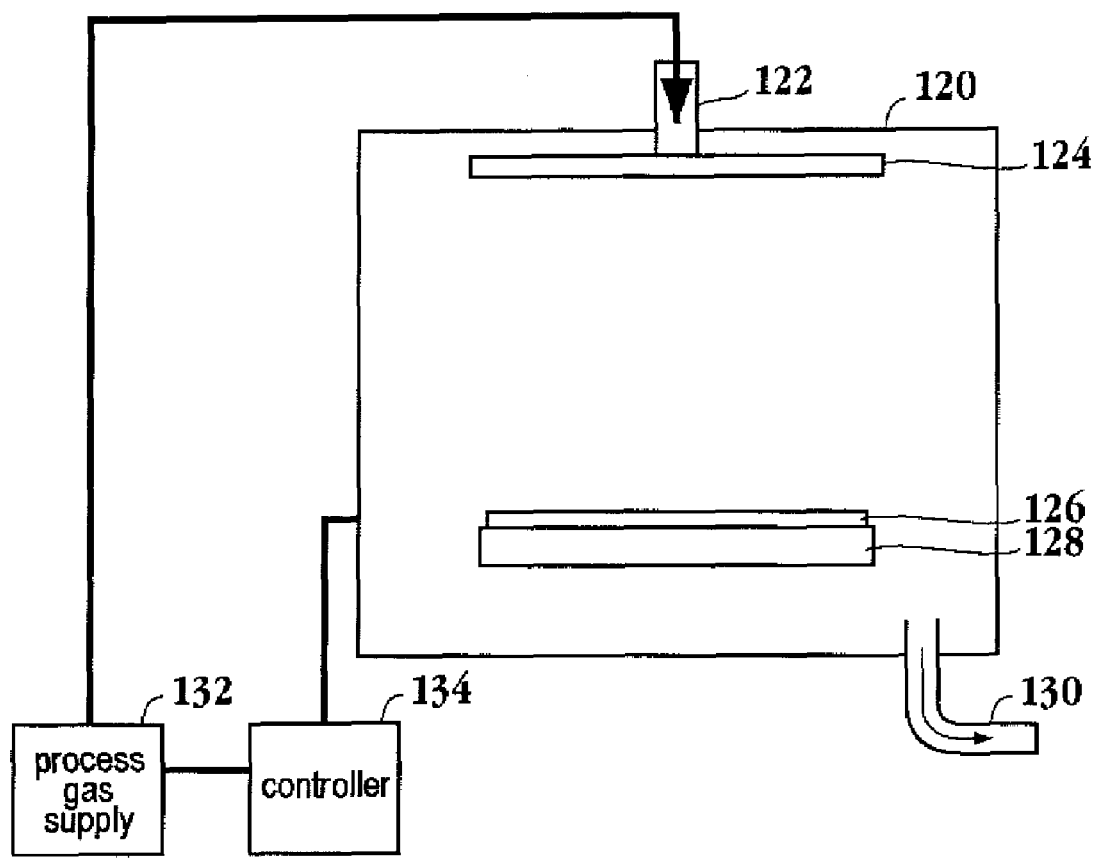
FIG. 11 is a simplified schematic diagram of an etch chamber configured to provide a silicon containing gas during an over etch process.

FIG. 11 is a simplified schematic diagram of an etch chamber configured to provide a silicon containing gas during an over etch process. Etch chamber 120 includes gas inlet 122, top electrode 124, electrostatic chuck 128 supporting wafer or semiconductor substrate 126. Etch chamber 120 also includes outlet 130 which may be in flow communication with a pump for evacuating the etch chamber. Process gas supply 132 is in flow communication with gas inlet 122. It should be appreciated that a passivation enhancing gas, e.g., a silicon containing gas as mentioned above, may be provided to the chamber through gas inlet 122. Controller 134, which is in communication with chamber 120 and process gas supply 134, may be configured to detect a passivation starved condition, i.e., an over etch process. In response to detecting the passivation starved condition, the controller may trigger process gas supply 134 to supply a silicon containing gas to chamber 120. It should be appreciated that controller 134 may detect the passivation starved condition through any suitable endpoint detection or the start of the over etch process may trigger the supply of the silicon containing gas. Furthermore, controller 134 is a general purpose computer in one embodiment.

The parameters associated with the introduction of the silicon containing gas, e.g., $SiCl_4$ are summarized in TABLE 1.

TABLE 1

| Pressure | 0.5-200 mTorr |
|---|---|
| Power | 10-5000 W |
| $SiCl_4$ flow | 0.1-300 sccm |
| Temperature | −77 C. to 200 C. |

It should be appreciated that TABLE 1 is exemplary and not meant to be limiting. That is, any suitable silicon containing gas may be used. Furthermore, depending on the chamber configuration, the range of parameters may vary.

In one embodiment, when $SiCl_4$ or another suitable Si containing gas is added to the gas mixture in the over etch step, the polysilicon is still etched, however, a protective deposition takes place on the gate oxide. That is, a thin layer of $SiO_x$, which may incorporate Br or Cl or any other suitable element present in the chamber, is deposited on the gate oxide or nitridized gate oxide. It should be appreciated that a source of oxygen is also provided to form the $SiO_x$ layer. The oxygen source for the thin layer may originate from the introduction of an oxygen containing gas or the presence of an oxygen containing component in the vessel, e.g., quartz, alumina, an oxygen containing component of the substrate being etched, etc. Further examples of an oxygen source are contained in U.S. application Ser. No. 10/607,293 entitled "In-Situ Pre-Coating of Plasma Etch Chamber for Improved Productivity and Chamber Condition Control," filed on Jun. 25, 2003. This application is incorporated by reference for all purposes including the pre-coating of the etch chamber for use with the embodiments described herein. It should be appreciated that the etch rate selectivity between polysilicon and oxide becomes infinite, i.e., there is no etching of the gate oxide, as a result of the deposition of the thin silicon containing oxide layer. Consequently, this results in improved gate integrity, i.e., minimal if any oxide loss, less silicon recess and significantly reduces the chances of pitting. Furthermore, the increased etch rate selectivity widens the process window since the process may operate in a region where pitting would otherwise occur without the improved selectivity.

In another embodiment, a solid source of silicon may be included in the chamber in order to provide the silicon for the passivation layer. That is, during an over etch process where the silicon being etched is substantially depleted, the solid source of silicon provides the silicon required for the passivation layer in order to prevent notching. For example, a top electrode of the etching chamber may include the solid silicon source, which may be triggered during the over etch step by applying a radio frequency (RF) bias to the top electrode.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by one skilled in the art without departing from the scope of the present invention as defined by the following claims.

The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims.

What is claimed is:

1. A method for etching a polysilicon gate structure in a plasma etch chamber, comprising:
    defining a pattern protecting a polysilicon film to be etched;
    striking a plasma;
    etching substantially all of the polysilicon film that is unprotected; and
    introducing a silicon containing gas that originates from a solid source of silicon contained within the plasma etch chamber and etching a remainder of the polysilicon film while introducing the silicon containing gas, wherein the silicon containing gas is selected from the group consisting of $SiH_3CH_3$, $SiH(CH_3)_3$, and Tetraethyl orthosilicate (TEOS).

2. The method of claim 1, wherein the solid source of silicon is included on a top electrode.

3. The method of claim 1, wherein the method operation of etching substantially all of the polysilicon film that is unprotected includes,
    executing a first etch to remove a hard mask; and
    executing a second etch to remove the polysilicon film that is unprotected.

4. The method of claim 1, wherein the method operation of introducing a silicon containing gas and etching a remainder of the polysilicon film while introducing a silicon containing gas includes,
    preventing notching at a base of the polysilicon gate structure.

5. The method of claim 1, wherein the method operation of introducing a silicon containing gas includes,
    terminating the etching of the polysilicon film that is unprotected; and
    striking an over etch plasma.

6. The method of claim 1, further comprising:
forming a passivation layer from byproducts generated from the etching of the polysilicon film.

7. A method for decreasing etch rate micro-loading between differently doped material of a substrate, comprising:
striking a plasma in a chamber;
etching a dual doped gate structure of the substrate, wherein the dual doped gate structure includes a n-doped polysilicon gate and a p-doped polysilicon gate, wherein the n-doped polysilicon gate and the p-doped polysilicon gate are contemporaneously etched;
forming a passivation layer from byproducts generated from the etching of the dual doped gate structure; and
enhancing the passivation layer, wherein the enhancing includes providing a silicon containing gas from a solid silicon source disposed within the chamber.

8. The method of claim 7, wherein the solid source of silicon is contained on an electrode of the chamber.

9. The method of claim 8, further comprising:
flowing the silicon containing gas between a flow rate of about 25 standard cubic centimeters per minute (sccm) and 300 sccm.

10. The method of claim 8, wherein the silicon containing gas is selected from the group consisting of $SiH_3CH_3$, $SiH(CH_3)_3$, $SiHCl_3$, and Tetraethyl orthosilicate (TEOS).

* * * * *